US011656280B2

(12) United States Patent
Valsan et al.

(10) Patent No.: US 11,656,280 B2
(45) Date of Patent: May 23, 2023

(54) DEVICE FOR CONDITION MONITORING AND PROTECTION OF ROTATING ELECTRICAL MACHINES, AND A METHOD THEREOF

(71) Applicant: ABB Schweiz AG, Baden (CH)

(72) Inventors: Simi Valsan, Kerala (IN); Arinjai Gupta, Bangalore (IN)

(73) Assignee: ABB Schweiz AG, Baden (CH)

(\*) Notice: Subject to any disclaimer, the term of this patent is extended or adjusted under 35 U.S.C. 154(b) by 275 days.

(21) Appl. No.: 17/050,850

(22) PCT Filed: May 30, 2019

(86) PCT No.: PCT/IB2019/054473
§ 371 (c)(1),
(2) Date: Oct. 27, 2020

(87) PCT Pub. No.: WO2019/229687
PCT Pub. Date: Dec. 5, 2019

(65) Prior Publication Data
US 2021/0072320 A1   Mar. 11, 2021

(30) Foreign Application Priority Data

May 31, 2018   (IN) .............................. 201841020550

(51) Int. Cl.
*G01R 31/34*   (2020.01)
*G01R 15/18*   (2006.01)
(Continued)

(52) U.S. Cl.
CPC ......... *G01R 31/343* (2013.01); *G01R 15/181* (2013.01); *G01R 19/0092* (2013.01);
(Continued)

(58) Field of Classification Search
CPC .............. G01R 31/343; G01R 15/181; G01R 19/0092; G01R 23/15; H02H 5/10; H02H 7/08; G01M 13/028
(Continued)

(56) References Cited

U.S. PATENT DOCUMENTS 3,246,104 A * 4/1966 Shockroo ............... H01H 61/02
                                                 337/109
3,418,531 A * 12/1968 Strachan ................ G03B 21/16
                                                 361/106
(Continued)

FOREIGN PATENT DOCUMENTS

WO    2011/006528 A1    10/2011

OTHER PUBLICATIONS

European Patent Office, International Search Report for PCT/IB2019/054473, dated Oct. 30, 2019, 4 pages.
(Continued)

*Primary Examiner* — Giovanni Astacio-Oquendo
(74) *Attorney, Agent, or Firm* — Leydig, Voit & Mayer, Ltd.

(57) ABSTRACT

The present disclosure discloses a device and a method for condition monitoring and protection of rotating electrical motors. The device receives measurements of current flowing in a power line connected to the rotating electrical machine. The device extracts a frequency band content containing information representative of condition of rotor bar from the measured current signal using wavelet filters. Further, the device compares the frequency band contents with a predefined threshold value and identifies a condition of the rotor bars. The condition includes damages caused to the rotor bars. Based on the condition, the IED generates one or more status signals (alarm signals or trip signals). The trip signal is provided to a switch connected to the power line to disconnect the rotating electrical machine.

14 Claims, 6 Drawing Sheets

(51) Int. Cl.
  *G01R 19/00* (2006.01)
  *G01R 23/15* (2006.01)
  *H02H 5/10* (2006.01)
  *H02H 7/08* (2006.01)
(52) U.S. Cl.
  CPC ............... *G01R 23/15* (2013.01); *H02H 5/10* (2013.01); *H02H 7/08* (2013.01)
(58) Field of Classification Search
  USPC .................................. 324/765.01, 537, 500
  See application file for complete search history.

(56) References Cited

U.S. PATENT DOCUMENTS

| | | | | |
|---|---|---|---|---|
| 5,726,905 | A * | 3/1998 | Yazici | G01R 31/343 702/77 |
| 9,869,721 | B2 * | 1/2018 | Lee | G01R 31/343 |
| 2002/0186039 | A1 | 12/2002 | Devaney et al. | |
| 2009/0146599 | A1 * | 6/2009 | Zhou | G01R 31/343 318/490 |
| 2010/0165521 | A1 | 7/2010 | Changali et al. | |
| 2011/0257934 | A1 * | 10/2011 | Dimino | G01R 31/343 702/183 |
| 2014/0045648 | A1 * | 2/2014 | Bangura | F02N 11/006 477/3 |

OTHER PUBLICATIONS

European Patent Office, Written Opinion for PCT/IB2019/054473, dated Oct. 30, 2019, 6 pages.

Levent Eren et al., "Motor Bearing Damage Detection Via Wavelet Analysis of the Starting Current Transient", IEEE Instrumentation and Measurement Technology Conference, May 21-23, 2001, 4 pages.

* cited by examiner

DEVICE FOR CONDITION MONITORING AND PROTECTION OF ROTATING ELECTRICAL MACHINES, AND A METHOD THEREOF

TECHNICAL FIELD

The present disclosure relates to condition monitoring and protection systems. More particularly, the present disclosure relates to a device for monitoring a condition of rotating electrical machines (motors) and generating a trip signal for protecting the motor from damage conditions caused by broken rotor bars in the rotating electrical machines.

BACKGROUND

Rotating electrical machine like a motor and a generator are used for industrial and commercial purposes. In industrial plants, induction motors are used extensively and are the motors are prone to damages. Damages in motors are caused due to various factors including temperature, overcurrent, vibrations, broken rotor bars, etc. The industrial plants are dependent on the motors and damages/faults can halt working of the industrial plant. Downtime in the industrial plants leads to economic loss.

Many techniques are used to monitor broken rotor bars in the motor and alert an operator to take immediate action to reduce downtime. Few conventional systems use offline techniques to analyze fault i.e., analysis is performed when rotor bars are broken, and the motor has ceased to operate or data is collected from the sensors installed in the motor for offline analysis performed to infer motor condition. The offline analysis of fault detection may use huge amount of data collected over a time and the analysis may not be able to provide or take corrective actions immediately on the onset of a fault or a damage condition. Therefore, it may not be evident in real time when the fault has occurred. Few other systems use parameters of motors during initiating the motor or during de-energizing the motor.

Therefore, such techniques monitor the condition of the motor and detect the breaking of the rotor bars relying on a batch of data, for example current values for 5 minutes, and do not provide real-time monitoring of the motor. Thus, these techniques provide monitored data for a time window which is generally large and may not protect the motor when a fault occurs within the time window.

Thus, there is a need to detect broken rotor bars in real time and protect the electrical rotating machines when a fault occurs in the machine and to provide a device (protection relay) that can monitor the condition of the machine (motor/rotating electrical machine) and also protect the machine.

SUMMARY

In an aspect of the invention, a device for monitoring condition of rotating electrical machines and protecting the rotating electrical machines is disclosed. The device is an Intelligent Electronic Device (IED) also referred as a protection relay configured to protect the rotating electrical machine, also referred as motor. The IED is configured to monitor a condition of the motor using a current signal received from a current sensor connected to measure the current flowing from the power supply to the motor. The IED is generally configured to protect the motor from severe damage (faults) occurring due to overcurrent condition, temperature overload, and in this invention also due to severe damages caused by broken rotor bars. When such damages (faults) occur, the IED provides a trip signal to isolate the motor electrically by operating a switch (circuit breaker) connecting the power supply with the motor.

The device mainly comprises an input interface, a processing unit and an output interface. The input interface is configured to receive current signal from the current sensor. The processing unit is provided to extract a frequency band content containing information representative of condition of rotor bar from the measured current signal and compare the extracted frequency band content with a threshold value for identifying a condition of rotor bars in the rotating electrical machine. The processing to identify condition of the rotor bars includes identifying damage associated with the rotor bar. The processing unit of the device generates one or more status signals based on the identified condition of the rotor bars. The output interface generates a trip signal to the switch based on at least one status signal from the one or more status signals for electrically disconnecting the rotating electrical machine and protecting the rotating electrical machine.

The device is also capable to work along with other protection functions normally provided by the IED (protection relay). Thus, the processing unit of the device is capable to identify the condition of the rotor bar status/damage along with processing to identify overcurrent fault and thermal overload fault.

In an embodiment, the processing unit of the protection relay extracts the frequency band content containing information representative of condition of rotor bar with wavelet filters. The processing unit for the purpose of wavelet filtering makes use of four consecutive samples of the measured current signals along with outputs from the wavelet filters provided in each stage. In an example, four stages of wavelet filters are used. Thus, the device provides a real time detection of damage by identifying one or more broken rotor bar conditions and providing trip signal when severe damage condition is detected (based on number of broken rotor bars).

The output interface of the device is configured to provide one or more status signals to a human machine interface (HMI) associated with the device for displaying the condition of the rotating electrical machine. The HMI can be a local HMI comprised in the device or/and a remote monitoring station in an industrial plant or in a digital (cloud) environment outside the industrial plant.

In an embodiment, the device provides at least one alarm indication (status signal) to indicate an onset of damage in the rotating electrical machine i.e. when breakage of a first rotor bar is detected.

In another embodiment, the device provides status signal indicative of a count of broken rotor bars i.e. number of rotor bars broken (as and when the breakage occurs) and also a trip signal to operate a switch to electrically isolate the motor. Such a trip signal can be based on comparison of the count of broken rotor bars with a predefined threshold value to identify a severely damaged condition.

In another aspect of the invention, a method for monitoring a condition of a rotating electrical machine and protecting the rotating electrical machine is provided. The method steps are executed by a protection relay (device) and the steps comprises: receiving a current signal from the current sensor (protection relay) to extract a frequency band content containing information representative of condition of rotor bar from the measured current signal; comparing the extracted frequency band content with a threshold value for identifying a condition of rotor bars in the rotating electrical machine including identifying a extent of damage associated with the rotor bar (number of broken rotor bars); providing status signals based on the identified condition of the rotor bars; and generating a trip signal to a switch based on status signals for electrically disconnecting the rotating electrical machine and protecting the rotating electrical machine.

In an embodiment, the trip signal is provided based on count of broken rotor bars identified by comparing the count of broken rotor bars with a predefined threshold value.

In another embodiment, the method uses wavelet filtering to extract the frequency band content containing information representative of condition of rotor bar.

BRIEF DESCRIPTION OF DRAWINGS

These and other features, aspects, and advantages of the present invention will become better understood when the following detailed description is read with reference to the accompanying drawings in which like reference numerals represent corresponding parts throughout the drawings, wherein:

FIG. 6 (a-e) is a waveform representation of frequency and time analysis of current signals, in accordance with an embodiment of the present disclosure;

DETAILED DESCRIPTION

As used herein and in the claims, the singular forms "a", "an", and "the" include the plural reference unless the context clearly indicates otherwise.

To address the problem as described herein above, an IED (Intelligent Electronic Device) or a protection relay of the disclosure provides a solution to monitor condition of a rotating electrical machine and protect the rotating electrical machines from faults and severe damage arising from broken rotor bars. In this disclosure, the protection relay/IED is also referred simply as a device.

Figure 1:
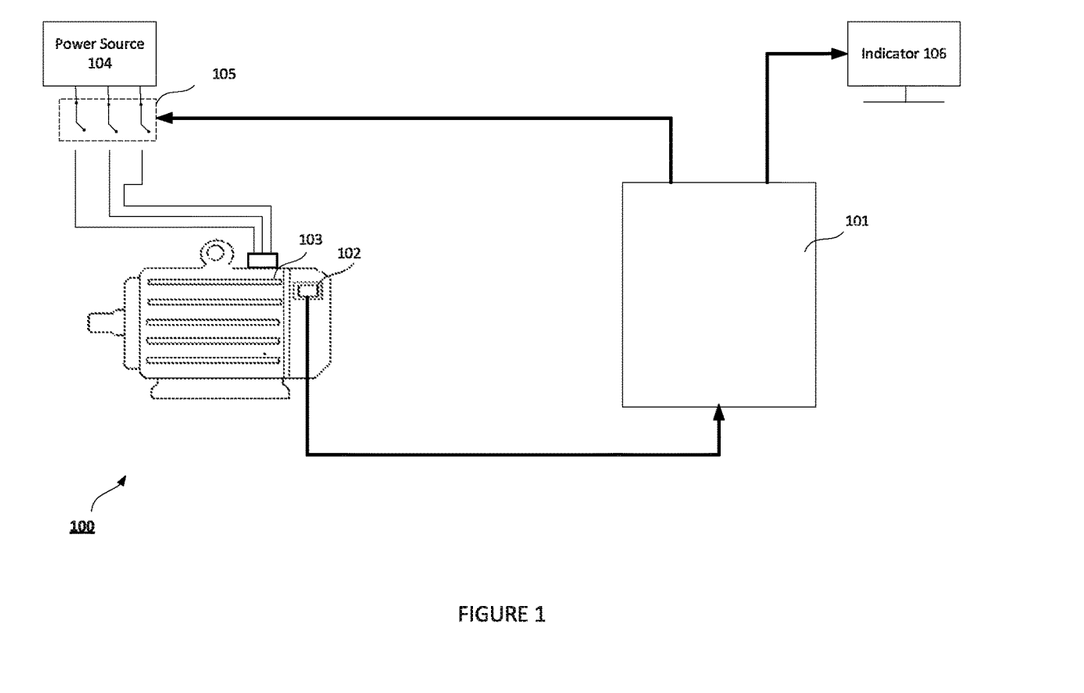
FIG. 1 is a simplified block diagram representation of an environment for condition monitoring and protection of a rotating electrical machine, in accordance with an embodiment of the present disclosure.

FIG. 1 shows an environment (100) comprising a rotating electrical machine (103), an intelligent electronic device (IED) (101), a current sensor (102), a power source (104), a switch (105) and a human machine interface (HMI) (106). In an embodiment, the environment (100) can be an industrial plant and the human machine interface (106) can be part of the IED. In another embodiment, the human machine interface (106) can be a remote client station used for monitoring of the motor/industrial plant. Here, the IED may also have a local HMI to indicate the status to the operator. In an embodiment, the rotating electrical machine is typically a motor (e.g., an induction motor). The motor (103) is powered by the power source (104). The power source (104) is a three-phase supply. A switch (105) is provided which electrically connects the power source (104) to the motor (103).

In an embodiment, the IED (101) is a protection relay configured for condition monitoring and protection of the motor (103). The current sensor (102) can be a current transformer or a Rogowski coil connected to an electrical line powering the electrical motor or can be mounted on the motor (103) such that the current sensor (102) measures a current in the stator of the motor (103). The current sensor (102) can be a part of a condition monitoring device which can be mounted on the motor (103) to measure vibrations in the motor (103), magnetic flux around the motor (103), temperature of the motor (103) etc. or can be used alone to provide current signals to the IED/protection relay for processing to detect a fault/damage condition related to the motor.

The IED (101) is configured to receive the current signals from the current sensor (102) and protect the motor from overcurrent faults, thermal faults, broken rotor bars fault, etc. When the IED (101) detects a fault e.g. an overcurrent fault or a severe damage condition (say arising when 6 bars from 10 bars are broken), a trip signal is generated for operating the switch (circuit breaker) to de-energize/power off the motor. The trip signal opens the switch (105) and electrically isolates the motor (103) from the power source (104). The IED (101) is also capable of generating alarm/status signals to indicate various conditions of the motor deterioration. For example, when a rotor bar gets broken an alarm/status signal can be generated to alert the operator. The operator can monitor the motor and can take appropriate actions (e.g., plan for maintenance or decide to switch off the motor before more bars break and replace the motor with a redundant motor). The IED (101) can display or provide annunciation using the HMI (Local HMI on the IED or through the remote HMI capable of generating an audio notification/visual notification or both using the status/alarm signal. The IED thus receives the current signal as input and performs processing of the current signal (discrete signal processing) with a processor and associated electronic/digital circuitries/modules to produce a trip signal to operate the switch for protection and status signals for indication of the condition of the motor. The trip signal and the status signals are referred as status signals in this invention. The control status signals can be analog signal or digital logical signals or a status data communicated digitally over a communication bus in a digital plant environment.

Figure 2:
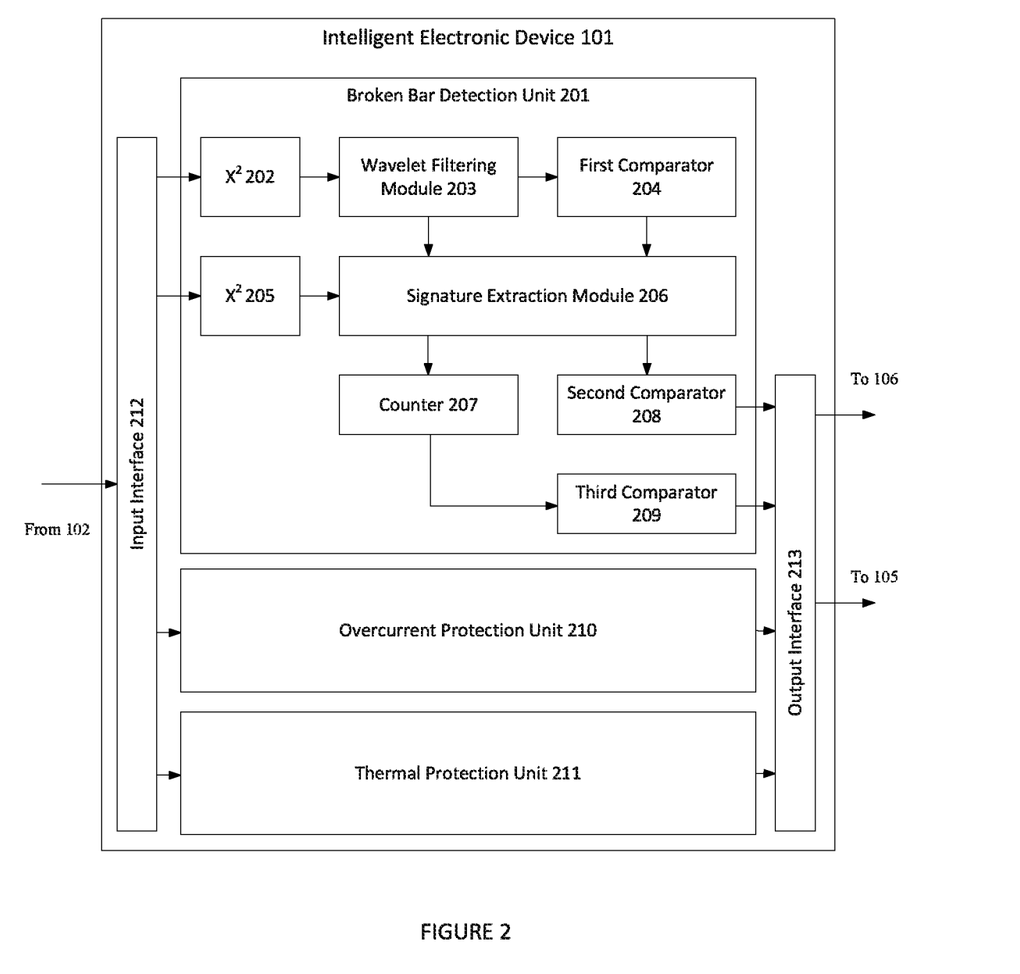
FIG. 2 is a block diagram representation of an IED for monitoring condition and protection of rotating electrical machine, in accordance with an embodiment of the present disclosure.

FIG. 2 is a block diagram representation of an IED (101) for monitoring condition and protection of the motor (103). The IED (101) comprises various signal processing units i.e. processing unit and interfaces to receive input signals and to provide output signals. The processing of the IED can be implemented with a processor executing a software program or/and through a combination with a hardware/firmware blocks. FIG. 2 depicts a broken bar detection unit (201), an overcurrent protection unit (210) and thermal protection unit (211), an input and output module shown separately as an input interface (212) and an output interface (213). The input interface receives the current signal from the current sensor (102). In a digitally enabled IED, the input interface can receive the current signal as a current data stream from the current sensor. The current signal is received continuously from the current sensor (102) to have instantaneous current values (sampled and digitized by an analog to digital convertor in the input interface incase analog current signal is received by the IED). RMS value of current signal can be computed by the IED and is used to normalize processing of signal to detect condition of the motor. Such normalization helps to configure the IED to detect condition of the motor irrespective of the rating of the motor, and thus the method of the invention can be easily applied for various motor ratings.

As mentioned before, the input interface can sample the current signal and converts the analog current signal to digital current values using an analog-digital converter or receive directly the digital data from the current sensor. In an example, the input interface samples the current signal such that at least 32 samples are available for an AC cycle (50 or 60 Hz). The input values of the current signal is also used by the overcurrent protection unit (210) and the thermal protection unit (211). The sampled digitized current signal is used by the broken bar detection unit (201) and in this invention, a wavelet technique is illustrated to find a condition of broken rotor bar. The output interface generates one or more status signals which comprises at least one trip signal to operate the switch, and additionally the status signal can include the indication of alarm/health status signals based on onset of damage condition and number of broken rotor bars. The one or more status signals can be an analog signal or a digital logical signal or a data transmitted in a digital communication bus. The trip signal can be generated based on evaluated condition of the broken rotor bar from the broken bar detection unit (201) and can also logically (OR logic combination) with the outputs of the overcurrent protection unit (210) and the thermal protection unit (211) to enable trip when there is a severe damage condition arising from the broken bars or any of the fault situations such as overcurrent fault or thermal fault (overload fault) to protect the motor. The trip signal is provided to the switch (105) and the alarm signal is provided to the HMI/indicator (106) which can be present in the IED as local HMI and/or can be a monitoring station (local to the plant or remote monitoring station outside the plant communicatively connected to the IED through the plant communication network).

The overcurrent protection unit (210) detects an overcurrent condition in the current signal received from the current sensor (102) and can cause the IED to generate a trip signal to isolate the motor (103) from the power source (104). Likewise, the thermal protection unit (211) estimates a temperature of the motor (103) using the current signal received from the current sensor (102). When the estimated value temperature of the motor is above a temperature threshold value, the trip signal is generated by the IED to protect from an overload condition.

The broken bar detection unit (201) detects broken bars in the motor (103) and evaluates condition of the motor (103). Also, number of broken rotor bars are identified. When there is a severe damage (fault) condition of the motor (103), i.e., when number of broken rotor bars are too many that can cause imminent failure, which can be configured in the IED by setting a threshold value for the number of rotor bar, the trip signal is generated. The detailed working of individual modules of the broken bar detection unit (201) is described below.

The broken bar detection unit (201) comprises processing modules to determine the condition of the rotor bar with help of a wavelet technique (as an example technique Daubechies wavelet is used). There is an $X^2$ module (202, 205), a wavelet filtering module (203), a first comparator (204), a signature extraction module (206), a counter (207), a second comparator (208) and a third comparator (209). The wavelet filtering module (203), the first comparator (204), the signature extraction module (206), the second comparator (208) and the third comparator (209) are together referred as the modules of the IED processing unit. The wavelet filtering module (203) and the signature extraction modules are used for extracting the frequency band of interest and conditioning the extracted frequency information to normalized decibel values for further processing required to identify and count rotor bar failure. The application of wavelet technique for identifying and counting rotor bar failure is provided below.

The current signal is passed through one or more filter stages, each filter stage has a set of filter coefficient for wavelet processing. Each filter receives at least four samples of the current signal (current Sq (n), current Sq (n−1), current Sq(n−2) and current Sq(n−3)). Each sample is multiplied with a filter coefficient and an approximation coefficient is estimated for each filter stage. The output of one filter stage is provided as input to a subsequent filter stage. The number of filters to be used is dependent on the required frequency. As the expected approximation coefficient is 0-12.5 Hz, five filters (filter stages) are used in the present invention. The following equations are used to traverse the different filter stage to obtain the approximation coefficients.

$$\text{approx\_coeff1}(n) = \text{abs}(WT\_coeff\_L(1)*\text{currentSq}(n)) + \text{abs}(WT\_coeff\_L(2)*\text{currentsq}(n-1)) + \text{abs}(WT\_coeff\_L(3)*\text{currentSq}(n-2)) + \text{abs}(WT\_coeff\_L(4)*\text{currentSq}(n-3)) \quad (1)$$

Here, in this example as four samples are considered, and currentSq (n) represents the latest sample acquired by the processor of the IED, then currentSq(n−1) represents the preceding sample and so on to capture the previous three samples for wavelet processing. The output of the filter is down sampled by 2 and the latest four values are stored for wavelet filtering by the next filter stage.

if (n%2==0)

$$\text{approx\_coeff1\_down}(n) = \text{approx\_coeff1}(n) \quad (2)$$

else $$\text{approxim\_coeff1\_down}(n) = \text{approx\_coeff1}(n-1) \quad (3)$$

The first comparator (204) detects a disturbance in the current signal by having an extra filter stage which extracts a still lower frequency band (0-6.25 Hz) and wherein the amplitude of this band is compared with a threshold to enable further modules that identify and count rotor bar failure. The $X^2$ module (202) and a $X^2$ module (205) modules are used to square the current signal values to increase resolution and to reduce (optimize) the number of filter stages. In this example, $X^2$ module (202) squares the digitized samples of the current signal and the $X^2$ module (205) squares the RMS value of the current signal. The squared current signal from the $X^2$ module (202) is provided to a wavelet filtering module (203). This module applies a wavelet function on the squared current signal to resolve the signal both in frequency and time domain. A person skilled in the art would recognize that application of the wavelet function on the current signal results in obtaining detail coefficients (high frequency components) and approximation coefficients (low frequency components). The aim of this invention is to obtain/extract the approximation coefficients for specific frequency bands that reflect the effect of broken rotor bars i.e. in case of motor health diagnosis, the rotor bar damages are manifested as low frequency signals in the stator current and the approximation coefficients provide for low frequency signal strength (amplitude) content in the current signal. The frequency band of interest is 0-12.5 Hz.

Figure 3:
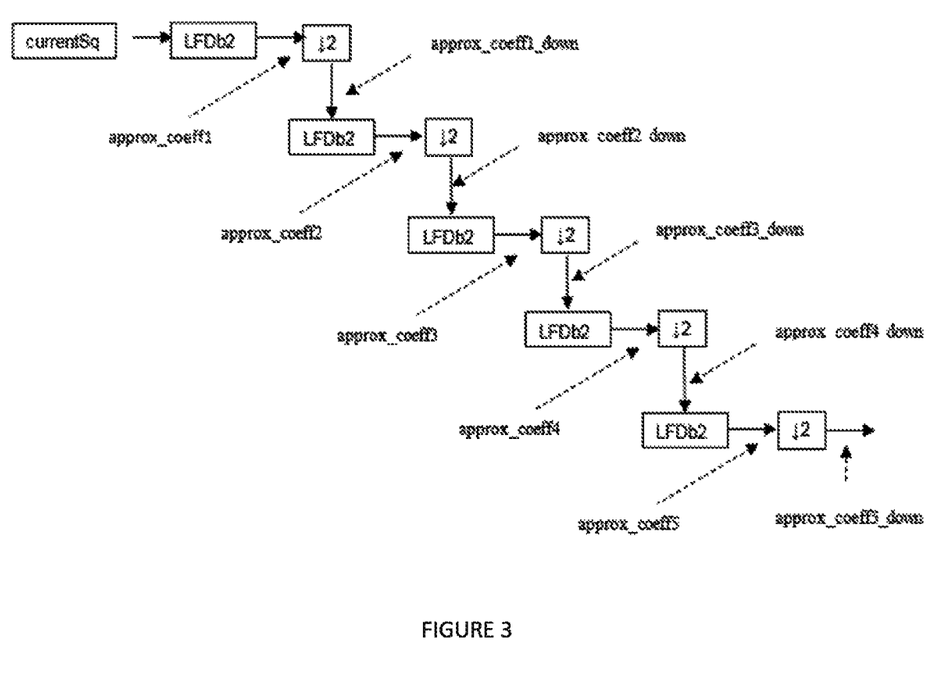
FIG. 3 is a flow diagram of wavelet decomposition to identify approximation coefficients, in accordance with an embodiment of the present disclosure.

FIG. 3 shows flow diagram of wavelet decomposition to identify approximation coefficients as per application of wavelet techniques known to the person skilled in the art. The output of each filter stage is passed through a low pass wavelet filter to extract the approximation coefficients associating the low frequency signal strength (amplitude). The output of the final filter stage is converted to decibel (dB) scale to highlight intensity of the frequency coefficients. The intensity values of the frequency in dB scale provides more clarity. Any general wavelet function can be used to extract the approximation coefficients.

The invention illustrates the invention with help of a wavelet technique to extract frequency band that is indicative of damages caused in the rotor bar (refer FIG. 2, wavelet filtering module, 203), detected through change in intensity of signal associated with the representative frequency bands (refer FIG. 2, signature extraction module and comparator modules, 208, 209), one skilled in the art would recognize that other techniques such as fast Fourier transforms can also be applied to extract select frequency band contents to identify damaged condition of the rotor bar.

Figure 4:
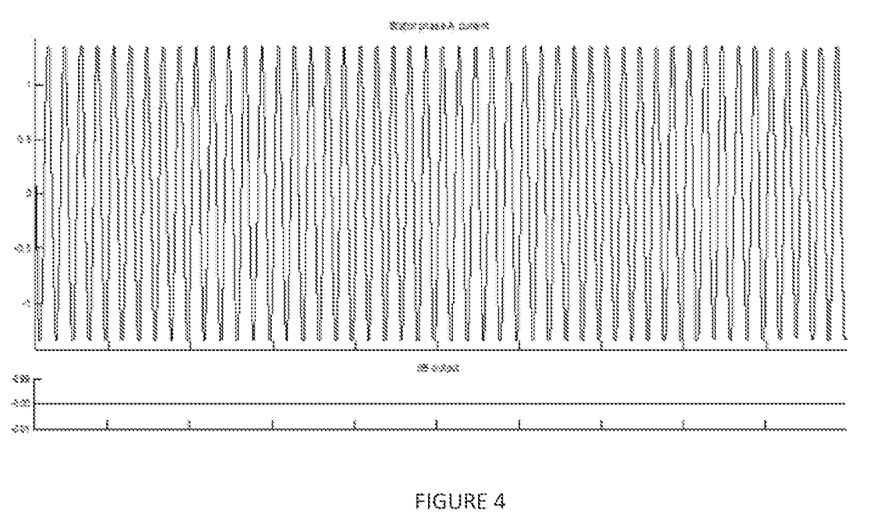
FIG. 4 is a waveform representation of frequency and time analysis of current signal in the rotating electrical machine during a healthy condition, in accordance with an embodiment of the present disclosure.

FIG. 4 is a waveform representation of frequency and time analysis of current signal in the rotating electrical machine during a healthy condition. In FIG. 4, the current signal (top) is shown as a function of time and the intensity of signal from the extracted frequency band (below) shown as a decibel (db) output to be steady (more or less constant) over time.

Figure 5:
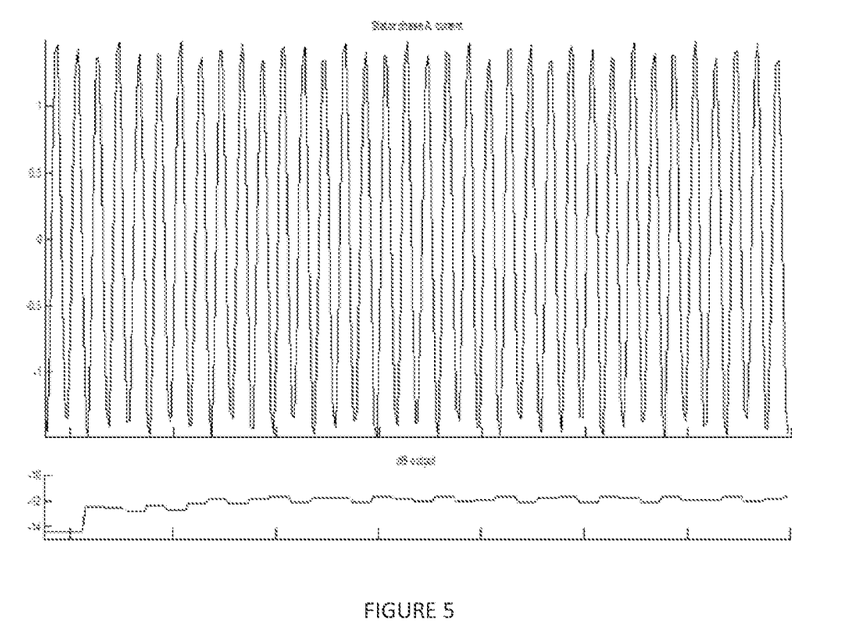
FIG. 5 is a waveform representation of frequency and time analysis of current signal in the rotating electrical machine during a fault condition, in accordance with an embodiment of the present disclosure.

FIG. 5 shows waveform of current signal (top) as a function of time along with signal intensity associated with the representative (extracted) frequency band content (below) that depict a rotor bar condition in the rotating electrical machine over time, captured for a rotor bar fault (severe damage) condition. As shown, in the figure, the current signal can be seen to have a low frequency oscillation superimposed to the mains (50/60 Hz) current signal indicating presence of rotor bar fault. This case is depicted for a severe damage with several rotor bars broken to visually indicate presence of low frequency content in the current signal.

In comparison to a healthy state, where the signal intensity of the extracted frequency content is low and steady, at the onset of a rotor bar failure (say first broken bar), the intensity of the extracted frequency signal varies substantially. The substantial difference/distortion in intensity of the frequency waveform is detected as an onset of an anomaly (defect condition) and associated to indicate a broken rotor bar by a second comparator block, 208 (FIG. 2). Subsequently, on breakage of further rotor bars, the intensity of the signal incrementally changes and can be detected when change is above a pre-computed threshold value, detected in a counter, 207 (FIG. 2).

Figure 6:
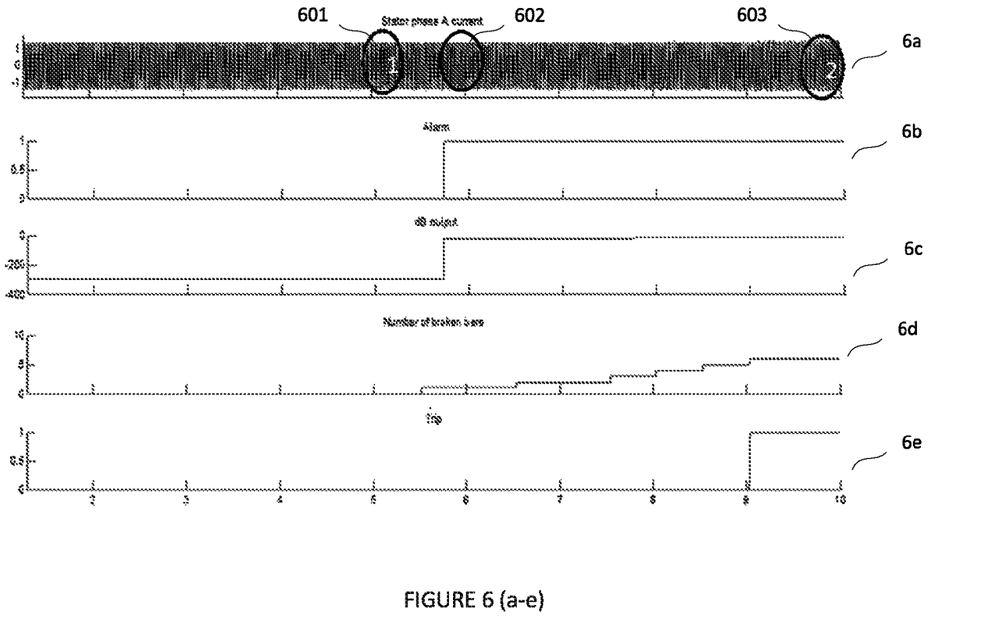

FIG. 6 (a-e) provides waveforms associated with frequency and time analysis of current signals. The figure shows the analysis of the frequency waveform from a healthy condition to 6 broken rotor bars.

During operation of the motor (103), when one rotor bar breaks, the intensity of the current signal waveforms changes. This change is referred as the first anomaly in the present disclosure. The first anomaly indicates that at least one rotor bar has broken and is detected with a second threshold by a second comparator (208, FIG. 2) and is also indicated by the status signal (alarm) to indicate onset of damage in rotor bar. Generally, when one rotor bar breaks, the motor (103) will still be capable of being operated. FIG. 6 provides an instant of time, 601, associated with a healthy state which results in a waveform such as that provided in FIG. 4 showing no significant low frequency signal strength and very low db amplitude value for the extracted low frequency band content. Another instant of time, 602, is provided for an event when the first rotor bar is broken resulting in significant increase in the low frequency signal strength (detected by comparison with a threshold in the second comparator), as depicted in 6c and providing an alarm indication (status signal) to indicate onset of damage in the motor.

A counter (207, FIG. 2) is used to keep track of number of broken rotor bars and is incremented each and every time a significant change in low frequency band content is detected, where the extracted low frequency signal intensity is compared with a dynamic threshold (adjusted depending on the number of broken rotor bars) to detect a significant change in signal intensity, performed within the counter module (207, FIG. 2). The output of counter block can also generate a status signal indicating progressive deterioration of the motor (condition of the motor). The number of broken rotor bar count can be counted by the counter, 207, and the value of counter can be compared in a third comparator, 209, with a pre-determined threshold to identify a condition for trip (also, a status signal) to de-energize the motor. Thus, a condition of the motor can be indicated by one or more status signal including a trip condition to trip the power supplied to the motor.

Referring again to FIG. 6a, 602 refers to a point where a first rotor bar is broken, i.e., the first anomaly is detected. When the first anomaly is detected, the value of the counter (207) is set. For the purpose of illustration, the initial dB value is set at −300 dB. That is, during normal operation of the motor (103), the intensity value of the extracted signal frequency waveform is small and can be around −300 dB. When an anomaly is detected the intensity value increases substantially, for example the intensity value increases to a much higher value, say to −30 dB or −40 db. Such substantial increase in the intensity value is detected as an anomaly and is indicative of an onset of a defect condition arising from a broken rotor bar. For example, when the intensity value is beyond a threshold band (second threshold) of −60 dB, such a change can be detected as an anomaly. The second threshold value can be changed based on motor parameters.

At a period between the event 602 and 603, the subsequent one or more anomalies are detected. For example, let us consider that 3 more rotor bars are broken. Thus, the counter value is updated to indicate that total of 4 rotor bars are broken. FIG. 6e depicts a generation of the trip signal when the number of broken rotor count reaches the value set as a threshold (in third comparator) and the condition at the time instant 603 corresponds to a severely damaged condition requiring maintenance and as an example can have waveforms as depicted in FIG. 5.

For illustration, let us consider that the threshold (third threshold value) for counter value is 6 (threshold for number of broken rotor bars) and the number of rotor bar broken is 5 before the event 603. Also, let us consider that the anomaly detected at 603 indicates that two more rotor bars are broken. Thus, the total counter value now is more than 6, which is more than the third threshold value. Thus, a severe damage condition (fault) can be detected in the motor (103) and the IED (101) based on the status signal (as an outcome of comparison by the third comparator) can be used by the output interface (213) to generate a trip signal. The output interface (213) provides the trip signal to the switch and decouples the electrical connectivity between the motor (103) and the power source (104). Additionally, the IED (101) can also generate the alarm signal to indicate that onset of fault and subsequent conditions arising from more rotor bar being broken in the motor (103).

The operation of the protection relay thus provides for a real time detection of the broken rotor bar condition. One can recognize that the described wavelet technique at any instant of operation relies on a fewer sample, in the example provided in the invention, four consecutive samples of the measured current signals along with the outputs from the wavelet filter stages are processed by the processing unit of the IED to detect a broken rotor bar condition and generate a status (including trip) signals. This results in an ability to detect a fault/damage condition within a few AC cycles, and thus provides for a fast-acting monitoring and protection unit for rotating electrical machine.

In an embodiment, the output interface (213) of the protection relay (IED) can logically combine the fault signal from the broken rotor bar detection unit (201) with the other fault conditions that can be detected by the protection relay, for example with the overcurrent protection unit (210) and the thermal protection unit (211) and generate a trip signal to activate the switch to disconnect the power supply to the motor. In this embodiment, the trip signal is generated when any of the fault conditions i.e. severe damage condition detection by the broken rotor bar detection unit, overcurrent fault detection by the overcurrent protection unit and overload condition detected by the thermal protection unit. The embodiment is described to illustrate fault conditions detected with the measured current signal, one skilled in the art would recognize that protection relay can also generate trip signal based on other measurements made by the protection relay (e.g., overvoltage condition by measurement of voltage signal).

Figure 7:
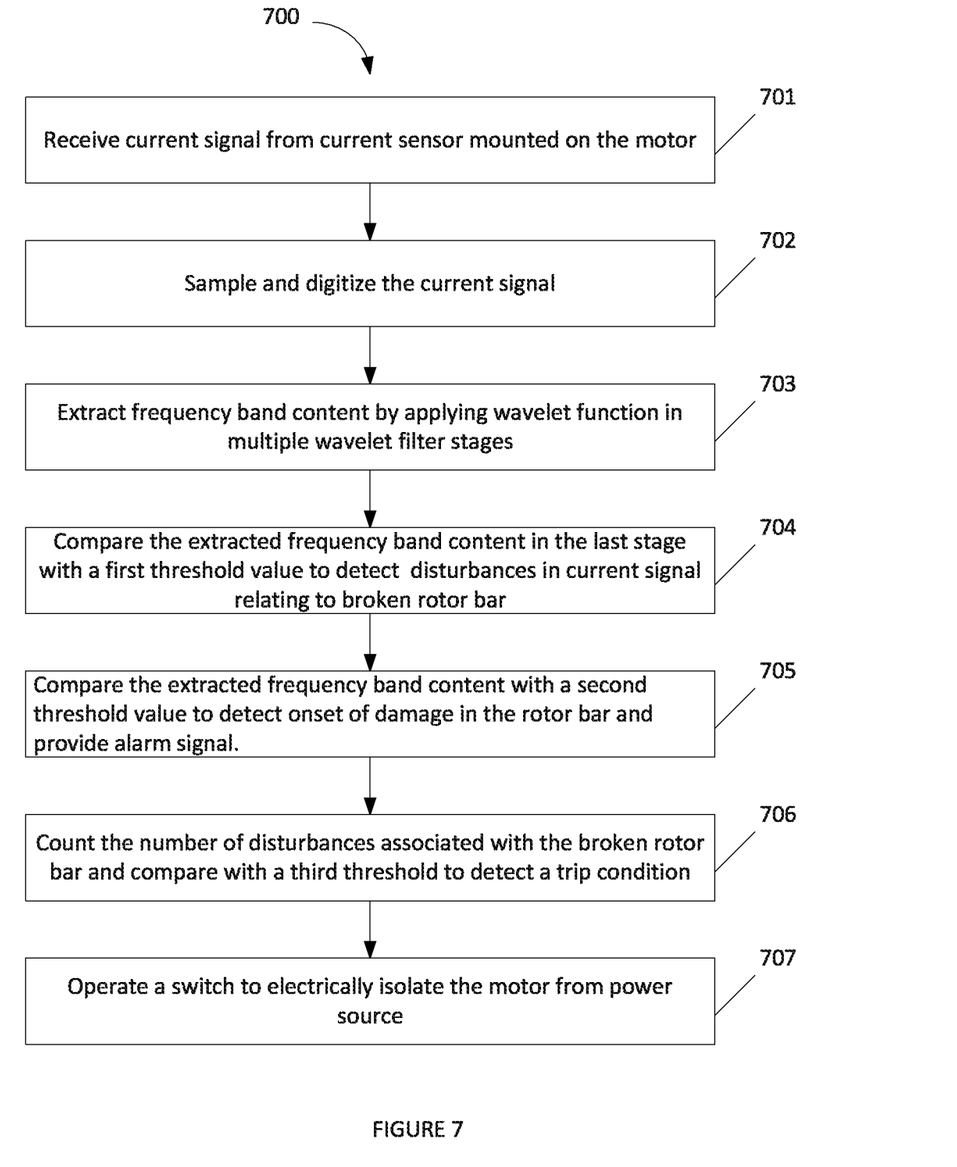
FIG. 7 is a flow chart illustrating method steps in accordance with an embodiment of the present disclosure.

FIG. 7 shows a flow chart illustrating a method for condition monitoring and protecting motor (103). At step 701, the IED (101) receives current signal from the current sensor (102).

At step 702, the IED (101) samples the current signals and converts the analog current signal to digital signal using analog to digital converter.

At step 703, the IED (101) applies a wavelet function on the digitized current signal to extract approximation coefficients. The approximation coefficients correspond to low frequencies in the current signal. Various filter stages are used to extract the required approximation coefficients (for example in the range 0-12.5 Hz) and also an additional filter stage (last filter stage) is used to identify disturbances in the measured electric current associated with the rotor bar condition.

At step 704, the extracted approximation coefficients and the frequency band content from the additional filter stage is compared with a first threshold value to detect disturbances associated with the rotor bar condition and to enable the broken rotor bar detection modules.

At step 705, the approximation coefficients are further compared with a second threshold to detect the first damage/anomaly. The one or more subsequent anomalies indicate that few more rotor bars are broken. For every broken bar detected, a counter value is updated.

At step 706, the counter value is compared with the third threshold. If the counter value is more than the third threshold, it may indicate that more than expected bars are broken. Thus, this condition of severe damage (fault) is identified and a trip signal can be initiated.

At step 707, the trip signal is generated as a result of the fault condition to operate the switch connected in the power line (power source) to power the motor.

The present invention provides various advantages. The present invention helps in early detection of broken bars. As the present invention is implemented in real time, the broken bars can be detected early. The present disclosure uses electrical current values which are generally available in protection relays. Thus, the present invention does not require additional hardware like vibration sensors. Also, the present invention can be implemented in existing IEDs/protection relay. The present invention can be implemented during operation of the motor and also when load is connected to the motor.

REFERRAL NUMERALS

Environment (100)
IED (101)
Current sensor (102)
Motor (103)
Power supply (104)
Switch (105)
Indicator (106)
Broken bar detection module (201)
Squaring module (202, 205)
Wavelet filtering module (203)
First comparator (204)
Signature extraction module (206)
Counter (207)
Second comparator (208)
Third comparator (209)
Overcurrent protection module (210)
Thermal protection module (211)
Input interface (212)
Output interface (213)

We claim:

1. A device for condition monitoring and protection of a rotating electrical machine based on measurements of current signal obtained with a current sensor measuring the current flowing in an electrical line powering the rotating electrical machine, wherein the device is configured to operate a switch to electrically disconnect the rotating electrical machine from the electrical line based on processing of the measured current, the device comprising:
   an input interface configured to receive current signal from the current sensor;
   a processing unit configured to:
   a) extract, using at least one wavelet filter, an approximation coefficient and a frequency band content containing information representative of a condition of a rotor bar from the measured current signal;
   b) compare the extracted frequency band content with a threshold value for identifying the condition of the rotor bar in the rotating electrical machine, wherein the condition of the rotor bar includes identifying damage associated with the rotor bar;
   c) provide one or more status signals based on the identified condition of the rotor bar; and
   an output interface configured to provide a trip signal to the switch based on at least one status signal from the one or more status signals, for electrically disconnecting the rotating electrical machine and protecting the rotating electrical machine based on the identified condition.

2. The device as claimed in claim 1, wherein the processing unit identifies the condition of the rotor bars including fault conditions for protecting the rotating electrical machine, wherein the fault conditions comprise at least one of rotor bar fault, overcurrent fault and thermal overload fault.

3. The device as claimed in claim 1, wherein the processing unit extracts the frequency band content containing information representative of the condition of the rotor bar with at least two wavelet filters.

4. The device as claimed in claim 3, wherein the processing unit uses four consecutive samples of the measured current signals along with outputs from the wavelet filters to provide a real time detection of damage by identifying one or more broken rotor bar conditions.

5. The device as claimed in claim 3, wherein the at least two wavelet filters comprises a first wavelet filter and a second wavelet filter, and an output of the first wavelet filter is provided to an input of the second wavelet filter.

6. The device as claimed in claim 5, wherein the output of the first wavelet filter is downsampled and provided as the input of the second wavelet filter.

7. The device as claimed in claim 3, wherein each wavelet filter of the at least two wavelet filters extracts a corresponding approximation coefficient.

8. The device as claimed in claim 1, wherein the output interface is configured to provide the one or more status signals to a human machine interface (HMI) associated with the device for displaying the condition of the rotating electrical machine, and wherein the HMI is at least one of a local HMI comprised in the device or a remote monitoring station.

9. The device as claimed in claim 1, wherein the processing unit provides at least one of an alarm indication from the one or more status signals to indicate an onset of damage in the rotating electrical machine.

10. The device as claimed in claim 1, wherein at least one status signal from the one or more status signals provides a count of broken rotor bars and wherein the trip signal is generated based on comparison of the count of broken rotor bars with a predefined threshold value.

11. The device as claimed in claim 1, wherein the processor is further configured to compare the extracted frequency band content and the at least one approximation coefficient with the threshold value for identifying the condition of the rotor bar.

12. A method for monitoring a condition of a rotating electrical machine and protecting the rotating electrical machine using measurements of current signal obtained with a current sensor measuring the current flowing in an electrical machine, the method comprising: receiving current signal from the current sensor;
  extracting, using at least one wavelet filter, an approximation coefficient and a frequency band content containing information representative of a condition of a rotor bar from the measured current signal;
  comparing the extracted frequency band content with a threshold value for identifying the condition of the rotor bar in the rotating electrical machine, wherein the condition of the rotor bar includes identifying damage associated with the rotor bar;
  providing one or more status signals based on the identified condition of the rotor bar; and
  generating a trip signal to operate a switch based on at least one status signal from the one or more status signals for electrically disconnecting the rotating electrical machine and protecting the rotating electrical machine.

13. The method as claimed in claim 12, wherein the step of providing the at least one status signal from the one or more status signals provides for a count of broken rotor bars and wherein the trip signal is generated based on comparison of the count of broken rotor bars with a predefined threshold value.

14. The method as claimed in claim 12, wherein the step of extracting the frequency band content containing information representative of the condition of the rotor bar is performed using at least two wavelet filters.

* * * * *